United States Patent
Bartko et al.

(10) Patent No.: US 12,313,666 B2
(45) Date of Patent: May 27, 2025

(54) METHOD AND DEVICE FOR EARLY WARNING OF DEVICE UNDER TEST FAILURE DURING AN ELECTROMAGNETIC COMPATIBILITY TEST

(71) Applicant: Rohde & Schwarz GmbH & Co. KG, Munich (DE)

(72) Inventors: Hendrik Bartko, Unterhaching (DE); Thomas Dier, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 215 days.

(21) Appl. No.: 18/315,127

(22) Filed: May 10, 2023

(65) Prior Publication Data
US 2024/0377447 A1    Nov. 14, 2024

(51) Int. Cl.
G01R 31/00    (2006.01)
G06N 20/00    (2019.01)

(52) U.S. Cl.
CPC ........... *G01R 31/002* (2013.01); *G06N 20/00* (2019.01)

(58) Field of Classification Search
CPC ............................... G01R 31/002; G06N 20/00
USPC .......................................................... 324/627
See application file for complete search history.

(56) References Cited

U.S. PATENT DOCUMENTS

| | | | |
|---|---|---|---|
| 2012/0197582 A1* | 8/2012 | Richardson | G06F 11/2733 702/122 |
| 2019/0187199 A1* | 6/2019 | Mellein | H04B 17/29 |
| 2020/0014471 A1* | 1/2020 | Gratzl | H04B 17/104 |
| 2021/0223301 A1* | 7/2021 | Heuel | G01R 31/2834 |
| 2021/0239747 A1 | 8/2021 | Chang et al. | |
| 2022/0365123 A1* | 11/2022 | Cheah | G01R 31/31924 |
| 2023/0111796 A1* | 4/2023 | Kannampalli | G06F 11/2263 714/26 |

\* cited by examiner

*Primary Examiner* — Raul J Rios Russo
(74) *Attorney, Agent, or Firm* — Studebaker Brackett PLLC

(57) ABSTRACT

A device for early warning of a device under test (DUT) failure during an electromagnetic susceptibility (EMS) test is provided. The device is configured to gradually increase perturbation of a DUT during the EMS test. The device is further configured to receive a monitoring result from the DUT being exposed to the increased perturbation, and to determine, by a machine learning (ML) model evaluating the monitoring result, a probability value of the monitoring result corresponding to a faultless operation mode of the DUT. The ML model was trained based on monitoring results obtained during undisturbed operation of the DUT.

15 Claims, 3 Drawing Sheets

METHOD AND DEVICE FOR EARLY WARNING OF DEVICE UNDER TEST FAILURE DURING AN ELECTROMAGNETIC COMPATIBILITY TEST

FIELD OF THE INVENTION

The present disclosure relates to electromagnetic compatibility testing. In particular, the disclosure relates to machine learning or artificial intelligence based prediction of a device under test failure in an EMS test.

TECHNICAL BACKGROUND

Many electronic devices or systems are subjected to electromagnetic compatibility (EMC) testing to ensure they comply with regulatory standards and do not cause or suffer from electromagnetic interference. During EMC testing, the device under test (DUT) is exposed to various electromagnetic disturbances or perturbations, and its performance is measured to verify compliance. However, some DUTs are very expensive (e.g., cars, airplanes, satellites etc.) and the risk of damage during EMC testing is a major concern for their owners.

Moreover, the current testing process involves slow and cautious increments in the perturbation strength to avoid any potential damage to the DUT. This approach not only prolongs the testing time but also requires constant manual supervision of the DUT status, which is both time-consuming and error prone. Furthermore, in some cases, there is no prior knowledge about the limits of the DUT's tolerance to electromagnetic perturbations, making it difficult to set appropriate testing parameters.

Therefore, there is a need for a testing method and device that overcomes these drawbacks.

SUMMARY OF THE INVENTION

Against this background, the object of the present disclosure is to provide a method and device which allow for EMC testing that can greatly reduce the risk of DUT damage, improve testing efficiency, and eliminates the need for constant manual supervision.

The present disclosure in particular allows for increasing the perturbation strength in a much faster and controlled manner, reducing the risk of DUT damage during EMC testing. Additionally, a method that automatically determines the limits of the DUT tolerance and eliminates the need for manual parameter setting and visual monitoring significantly improves the testing process.

The invention is set out in the appended set of claims. The object is solved by the features of the independent claims. The dependent claims contain further developments.

In this disclosure, the terms electromagnetic susceptibility (EMS) and electromagnetic compatibility (EMC) are used synonymously.

A first aspect of the present disclosure provides a device for early warning of a device under test (DUT) failure during an electromagnetic susceptibility (EMS) test, wherein the device is configured to gradually increase perturbation of a DUT during the EMS test; receive a monitoring result from the DUT being exposed to the increased perturbation; and determine, by a machine learning (ML) model evaluating the monitoring result, a probability value indicating if the monitoring result corresponds to a faultless operation mode of the DUT, wherein the ML model was trained based on monitoring results obtained during undisturbed operation of the DUT.

This ensures that a risk of DUT destruction during an EMS test is greatly reduced, and a perturbation strength can be increased faster during the EMS test. Further, constant attention and visual monitoring of the DUT is no longer required.

In particular, the DUT can be at least one of: a car, a truck, an airplane, a helicopter, a drone, a satellite.

In particular, an EMS test can also be called electromagnetic compatibility (EMC) test.

In particular, an EMS or EMC test ensures that an electronic or electrical device doesn't emit a large amount of electromagnetic interference and/or that the device continues to function as intended in the presence of an electromagnetic phenomena. In particular, the electromagnetic phenomena is created by the gradually increasing perturbation.

In particular, the perturbation can be an electromagnetic signal. In particular, the perturbation is generated by the device itself. In particular, the perturbation is generated by an external perturbation device which can be controlled by the device.

In particular, the monitoring result comprises a monitoring channel. There can be an arbitrary number of monitoring channels in the monitoring result, e.g., 1, 2, 3, . . . , 64, or even more. In particular, a monitoring channel relates to monitoring of at least one of: a temperature reading, a power level, a pressure reading, a torque level.

In particular, the faultless operation mode is an operation mode in which the DUT works as intended (that is, as if there was no perturbation).

In particular, the undisturbed operation is an operation mode in which the DUT is not exposed to perturbation.

In particular, the DUT is external to the device.

In an implementation form of the first aspect, the device is further configured to display the probability value to a user of the device.

Thereby, the user can be informed about the chance that the DUT is destroyed during the EMS test and can e.g., interrupt the EMS test or stop increasing the perturbation strength.

In a further implementation form of the first aspect, the device is configured to compare the probability value to a threshold value.

Thereby, the device advantageously can perform automated actions, depending on whether the threshold value is exceeded or not.

In a further implementation form of the first aspect, the device is configured to obtain the threshold value via user input; and/or automatically based on prior threshold knowledge.

This ensures that the threshold can be flexibly set according to a user need or can be determined in an advantageous and automated manner.

In a further implementation form of the first aspect, the device is configured to, if the probability value exceeds the threshold value, perform at least one of the following: output a warning message to a user of the device; generate a report; do not further increase the perturbation; stop the perturbation.

This ensures that, in case that the DUT would be damaged if the perturbation strength is increased any further, a user can be warned, can be informed based on the report, or the EMS test can be stayed or stopped.

In particular, the report is generated based on the monitoring result and/or the probability value.

In a further implementation form of the first aspect, the ML model further was trained based on monitoring results relating to a failure of a DUT undergoing an EMS test.

This ensures that the ML model can not only detect if the current state of the DUT corresponds to a faultless state (that is, a state in which no perturbation is applied), but can also determine, if the DUT is in a state in which a failure of the DUT during an EMS test is imminent or is already present.

In a further implementation form of the first aspect, the device is configured to highlight a category of the monitoring result to a user of the device, in particular if the probability value exceeds a threshold value.

This ensures that the user is informed in detail about what kind of applied perturbation may lead to destruction of the device.

In particular, the category corresponds to the information in the channel.

A second aspect of the present disclosure provides a method for early warning of a DUT failure during an EMS, test wherein the method comprises the steps of: gradually increasing, by a device, perturbation of a DUT during the EMS test; receiving, by the device, a monitoring result from the DUT being exposed to the increased perturbation; and determining, by a machine learning, ML, model of the device evaluating the monitoring result, a probability value indicating if the monitoring result corresponds to a faultless operation mode of the DUT, wherein the ML model was trained based on monitoring results obtained during undisturbed operation of the DUT.

In an implementation form of the second aspect, the method further comprises the step of displaying, by the device, the probability value to a user of the device.

In a further implementation form of the second aspect, the method further comprises the step of comparing, by the device, the probability value to a threshold value.

In a further implementation form of the second aspect, the method further comprises the step of obtaining, by the device, the threshold value via user input; and/or obtaining, by the device the threshold value automatically based on prior threshold knowledge.

In a further implementation form of the second aspect, the method further comprises the step of, if the probability value exceeds the threshold value, performing, by the device at least one of the following: outputting a warning message to a user of the device; generating a report; not further increasing the perturbation; stopping the perturbation.

In a further implementation form of the second aspect, the ML model (103) further was trained based on monitoring results relating to a failure of a DUT undergoing an EMS test.

In a further implementation form of the second aspect, the method further comprises the step of highlighting, by the device, a category of the monitoring result to a user of the device, in particular if the probability value exceeds a threshold value.

The second aspect and its implementation forms include the same advantages as the first aspect and its respective implementation forms.

A third aspect of the present disclosure provides a computer program comprising instructions which, when the program is executed by a computer, cause the computer to carry out the method according to the second aspect or any of its implementation forms.

The third aspect and its implementation forms include the same advantages as the first aspect and its respective implementation forms.

An exemplary embodiment of the invention is now further explained with respect to the drawings by way of examples only, in which FIG. 1 shows a schematic view of a device according to an embodiment of the present disclosure;

DETAILED DESCRIPTION

Figure 1:
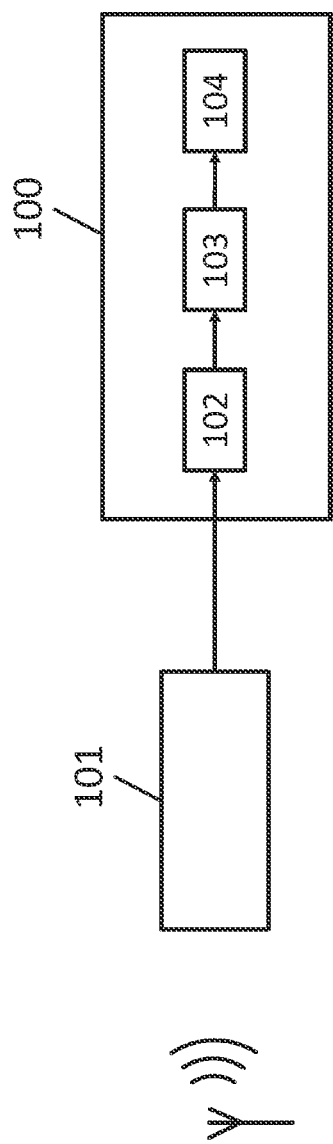

FIG. 1 shows a schematic illustration of a device 100. The figure depicts the overall device 100 for early warning of a DUT failure during an EMS test. The device is configured to gradually increase perturbation of a DUT 101 during the EMS test. It also receives a monitoring result 102 from the DUT 101 being exposed to the increased perturbation. The device then determines, by a machine learning (ML) model 103 evaluating the monitoring result 102, a probability value 104 indicating if the monitoring result 102 corresponds to a faultless operation mode of the DUT 101.

The ML model 103 was trained based on monitoring results obtained during undisturbed operation of the DUT 101. The ML model 103 further can be trained based on monitoring results relating to a failure of a DUT undergoing an EMS test.

It should be noted that the current invention is not limited to EMS tests only, but can be utilized in any testing scenario where a DUT is exposed to external influences such as temperature, pressure, vibration, and others.

Figure 2:
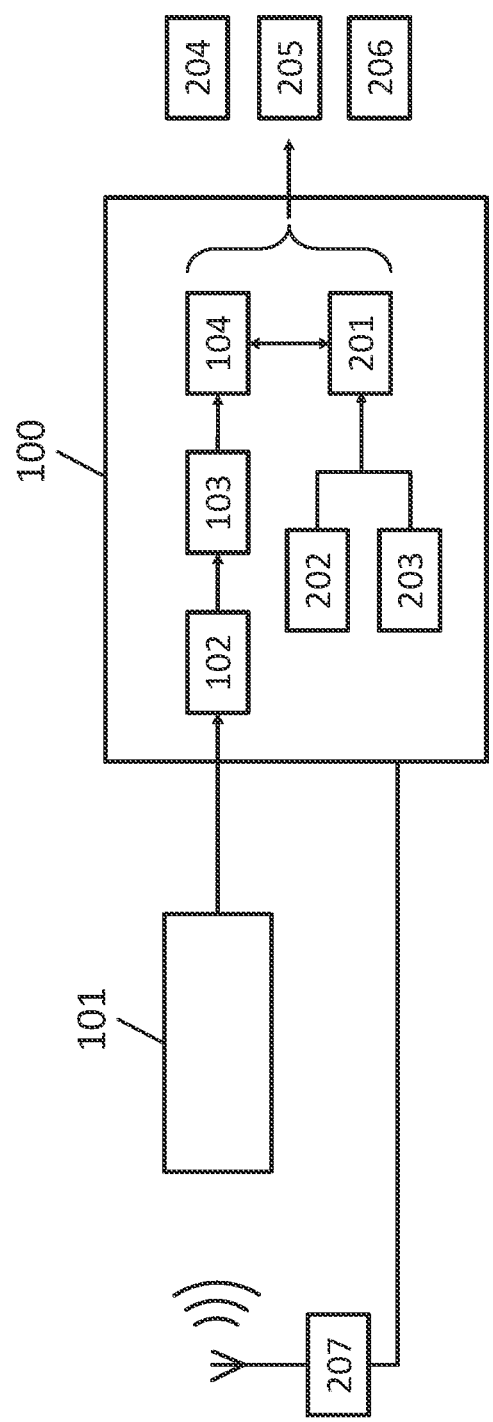
FIG. 2 shows a schematic view of a device according to an embodiment of the present disclosure in more detail.

FIG. 2 shows a schematic illustration of the device 100 in more detail. FIG. 2 in particular shows the optional features of the device 100. That is, each feature described below can be added to the device of FIG. 1, independently from other features described.

As shown, the device 100 can be further configured to display the probability value 104 to a user of the device 100.

The device 100 can be configured to compare the probability value 104 to a threshold value 201. The threshold value 201 can be obtained via user input 202 or automatically based on prior threshold knowledge 203.

In particular, the user input 202 allows the device to obtain the threshold value 201 through user interaction, which may involve the user setting a specific threshold based on their prior knowledge or preferences. The prior threshold knowledge 203 allows the device to automatically obtain the threshold value 201 based on pre-existing knowledge of the DUT 101 or other similar devices, such as industry standards or previous test results.

If the probability value 104 exceeds the threshold value 201, the device 100 can perform at least one of the following: outputting a warning message 204 to a user of the device 100, generating a report 205, do not further increase the perturbation, or stop the perturbation. These optional features allow the user to take immediate action if the DUT is operating outside of its normal range.

The device 100 can be further configured to highlight a category 206 of the monitoring result 102 to a user of the device 100, in particular if the probability value 104 exceeds a threshold value. This optional feature can be used to provide the user with additional information about the nature of the problem, for example, by highlighting whether the is to fault related temperature, power levels, pressure readings, torques, or other channels being monitored during the EMS test. This can help the user to quickly identify and diagnose the issue with the DUT 101.

The device 100 can also control an external device 207 which performs the EMS test. In particular, the device 100 can control the device 207 regarding the perturbation strength.

During an EMS test, the correct operation of a DUT 101 is being monitored by many channels, e.g., 64 channels in the EMCan monitoring of Elektra. Such channel values may be temperature readings, power levels, pressure readings, torques, etc.

Many DUTs 101 are very expensive (e.g., cars, airplanes, satellites etc.) and a DUT owner wants to circumvent a possible destruction of the DUT 101 during the EMS test. Unfortunately, often there is no a priori knowledge about limits per channel or per combination of channels, and the user may not be warned about an imminent DUT failure. To address this issue, the device 100 collects readings of all channels without external perturbation in all possible modes of operation of the DUT 101. The device 100 then trains the ML model 103 using this data for outlier detection, allowing, based on the input of a single measurement vector (of e.g., 64 channel measurements), to output a measure of the probability that the measurement vector is within a "normal" range of operation.

The device 100 then can turn on perturbation, slowly increase perturbation level, and input the readings of the DUT monitoring channels to the ML model, outputting a measure of the probability 104 that the measurement vector is within the normal operation mode, and displaying this measure to the user.

The device 100 compares the output measure with at least one threshold (e.g., one warning threshold, one error threshold), which can either be user-selected or rely on defaults. If the threshold is exceeded, the device 100 issues a warning message to the user, generates a report, does not further increase perturbation, turns off perturbation or performs any combination of.

The machine learning model 103 e.g., identifies abnormal behavior in the DUT 101 by monitoring the interrelating behavior between different channels. Specifically, abnormal behavior is identified when two or more channels start increasing or decreasing together, which indicates a correlation between the channels, also known as cross correlation. The ML model can also take into account changes in the threshold value 201 as the DUT 101 ages, which can be based on prior knowledge or preferences of the user, or pre-existing knowledge of the DUT 101 or similar devices.

Figure 3:
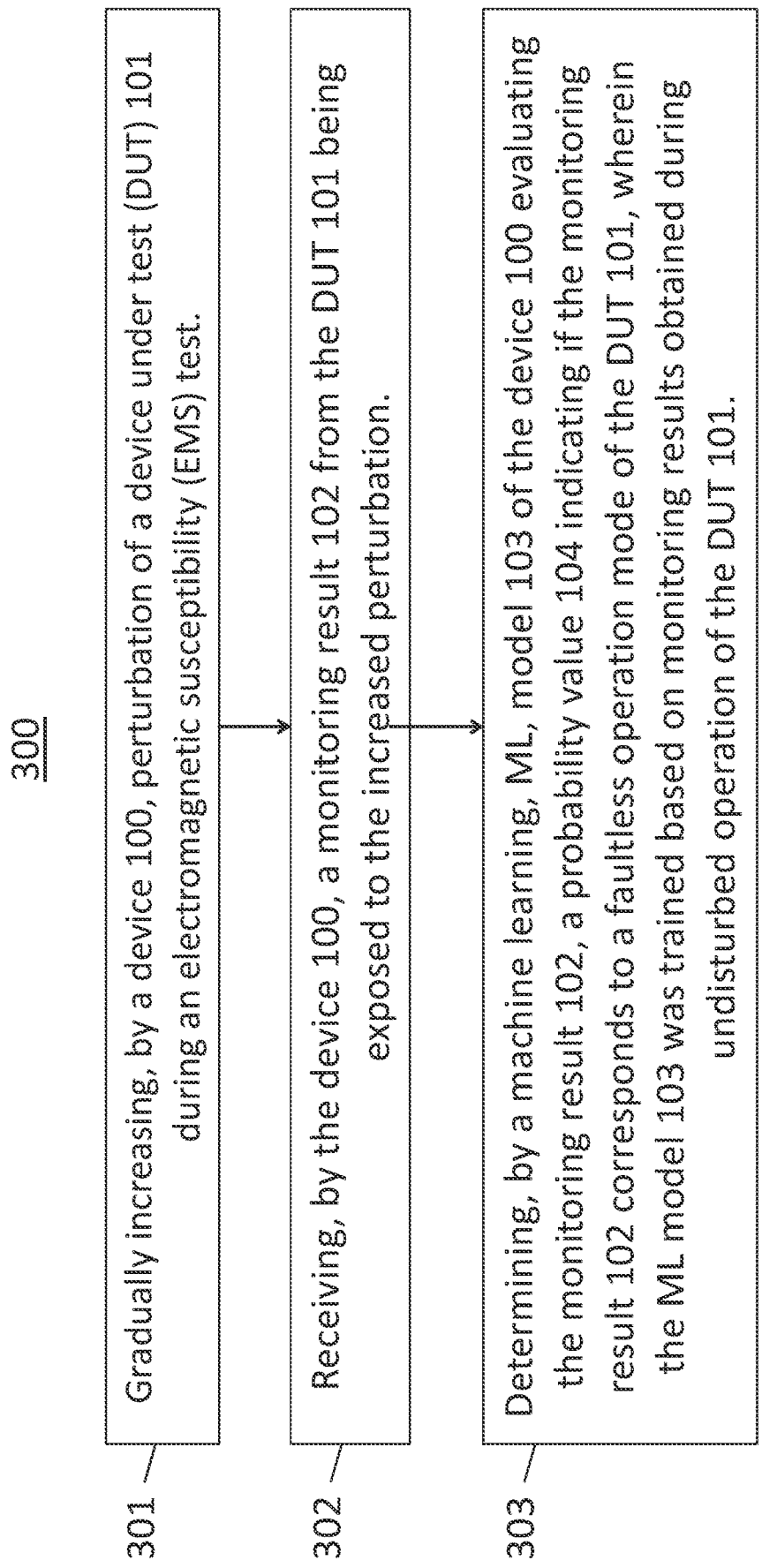
FIG. 3 shows a schematic view of a method according to an embodiment of the present disclosure.

FIG. 3 schematically shows a method 300 for early warning of a DUT failure during an EMS test that includes the following steps:

Step 1: Gradually increase perturbation of DUT during EMS test 301. During the EMS test, the device 100 gradually increases the perturbation of the DUT 101. The perturbation may be increased by adjusting one or more parameters, such as temperature, power levels, pressure readings, etc. The torques, gradual increase in perturbation is intended to ensure that the DUT is not immediately subjected to excessive stress, which could result in its failure. This step may be carried out using a computer or other electronic device.

Step 2: Receive monitoring result from the DUT 302. After the perturbation has been gradually increased, the device 100 receives a monitoring result 102 from the DUT 101 being exposed to the increased perturbation. The monitoring result may include readings from various channels, such as temperature readings, power levels, pressure readings, torques, etc., that are being monitored during the EMS test.

Step 3: Determine probability value indicating faultless operation of the DUT 303. The device 100 uses a ML model 103 to evaluate the monitoring result 102 and determine a probability value 104 indicating whether the monitoring result 102 corresponds to a faultless operation mode of the DUT 101. The ML model 103 was trained based on monitoring results obtained during undisturbed operation of the DUT 101. The ML model 103 may be trained using outlier detection algorithms that allow the input of a single measurement vector of e.g., 64 channel measurements and outputs a measure of the probability that the measurement vector is within a "normal" range of operation. The probability value 104 may be displayed to the user of the device 100.

Overall, the method 300 provides early warning of a possible DUT failure during the EMS test by gradually increasing the perturbation of the DUT 101, receiving a monitoring result 102 from the DUT 101 being exposed to the increased perturbation, and using an ML model 103 to evaluate the monitoring result 102 and determine a probability value 104 indicating whether the monitoring result 102 corresponds to a faultless operation mode of the DUT 101.

It is important to note that the inventive device and method very closely correspond. Therefore, all the above said regarding the device is also applicable to the method. Everything which is described in the description and/or claimed in the claims and/or drawn in the drawings can be combined.

The invention is not limited to the illustrated embodiment. The network devices may be mobile terminals such as mobile phones, but also computers such as personal computers or the like. All features described above, or features shown in the figures can be combined with each other in any advantageous manner within the scope of the invention.

The invention claimed is:

1. A device for early warning of a device under test, DUT, failure during an electromagnetic susceptibility, EMS, test, wherein the device includes a computer that is configured to:
   gradually increase perturbation of a DUT during the EMS test, wherein the perturbation is increased by the computer to adjust one or more parameters selected from temperature, power, pressure, or torque;
   receive a monitoring result from the DUT being exposed to the increased perturbation; and
   determine, by a machine learning, ML, model evaluating the monitoring result, a probability value indicating if the monitoring result corresponds to a faultless operation mode of the DUT, wherein the ML model was trained based on monitoring results obtained during undisturbed operation of the DUT.

2. The device according to claim 1, further configured to display the probability value to a user of the device.

3. The device according to claim 1, further configured to compare the probability value to a threshold value.

4. The device according to claim 1, wherein the device is further configured to obtain a threshold value via user input; and/or wherein the device is further configured to obtain the threshold value automatically based on prior threshold knowledge.

5. The device according to claim 3, further configured to, if the probability value exceeds the threshold value, perform at least one of the following: output a warning message to a user of the device; generate a report; do not further increase the perturbation; stop the perturbation.

6. The device according to claim 1, wherein the ML model further was trained based on monitoring results relating to a failure of a DUT undergoing an EMS test.

7. The device according to claim 1, further configured to highlight a category of the monitoring result to a user of the device when the probability value exceeds a threshold value.

8. A method for early warning of a device under test, DUT, failure during an electromagnetic susceptibility, EMS, test, wherein the method comprises the steps of:
   gradually increasing, by a device including a computer, perturbation of a DUT during the EMS test, wherein the perturbation is increased by the computer to adjust one or more parameters selected from temperature, power, pressure, or torque;
   receiving, by the device, a monitoring result from the DUT being exposed to the increased perturbation; and
   determining, by a machine learning, ML, model of the device evaluating the monitoring result, a probability value indicating if the monitoring result corresponds to a faultless operation mode of the DUT, wherein the ML model was trained based on monitoring results obtained during undisturbed operation of the DUT.

9. The method according to claim 8, further comprising the step of displaying, by the device, the probability value to a user of the device.

10. The method according to claim 8, further comprising the step of comparing, by the device, the probability value to a threshold value.

11. The method according to claim 8, further comprising the step of obtaining, by the device, a threshold value via user input; and/or obtaining, by the device the threshold value automatically based on prior threshold knowledge.

12. The method according to claim 8, further comprising the step of, if the probability value exceeds a threshold value, performing, by the device at least one of the following: outputting a warning message to a user of the device; generating a report; not further increasing the perturbation; stopping the perturbation.

13. The method according to claim 8, wherein the ML model further was trained based on monitoring results relating to a failure of a DUT undergoing an EMS test.

14. The method according to claim 8, further comprising the step of highlighting, by the device, a category of the monitoring result to a user of the device when the probability value exceeds a threshold value.

15. A non-transitory computer-readable storage medium storing instructions which, when executed by the computer, cause the computer to carry out the steps according to claim 8.

\* \* \* \* \*